United States Patent
Lin et al.

(10) Patent No.: US 9,865,523 B2
(45) Date of Patent: Jan. 9, 2018

(54) ROBUST THROUGH-SILICON-VIA STRUCTURE

(71) Applicant: Taiwan Semiconductor Manufacturing Company, Ltd., Hsin-Chu (TW)

(72) Inventors: Yung-Chi Lin, Su-Lin (TW); Tsang-Jiuh Wu, Hsin-Chu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/158,577

(22) Filed: Jan. 17, 2014

(65) Prior Publication Data

US 2015/0206823 A1   Jul. 23, 2015

(51) Int. Cl.
*H01L 29/40* (2006.01)
*H01L 23/48* (2006.01)
*H01L 21/768* (2006.01)

(52) U.S. Cl.
CPC ...... *H01L 23/481* (2013.01); *H01L 21/76877* (2013.01); *H01L 21/76898* (2013.01); *H01L 21/76807* (2013.01); *H01L 2924/0002* (2013.01)

(58) Field of Classification Search
CPC ......... H01L 21/76816; H01L 21/76898; H01L 23/481; H01L 21/76877; H01L 21/76897
See application file for complete search history.

(56) References Cited

U.S. PATENT DOCUMENTS

| | | | |
|---|---|---|---|
| 5,175,125 A | 12/1992 | Wong | |
| 6,376,353 B1 * | 4/2002 | Zhou | H01L 21/32134 257/E21.309 |
| 7,019,402 B2 * | 3/2006 | Andry | H01L 21/76898 118/722 |
| 7,061,118 B2 * | 6/2006 | Masuda | H01L 21/76898 257/191 |
| 7,279,411 B2 * | 10/2007 | Agarwala | H01L 21/76802 257/E21.309 |
| 7,741,226 B2 | 6/2010 | Andry et al. | |
| 7,919,835 B2 * | 4/2011 | Akiyama | H01L 21/768 257/621 |
| 7,977,133 B2 | 7/2011 | Yoo | |
| 8,232,648 B2 * | 7/2012 | McGahay | H01L 21/76898 257/758 |
| 8,304,863 B2 * | 11/2012 | Filippi | H01L 21/76898 257/621 |

(Continued)

*Primary Examiner* — Jesse Y Miyoshi
*Assistant Examiner* — Tuan A Hoang
(74) *Attorney, Agent, or Firm* — Slater Matsil, LLP

(57) ABSTRACT

Methods and apparatus entailing an interconnect structure comprising interconnect features disposed in dielectric material over a substrate. Each interconnect feature comprises an interconnect member and a via extending between the interconnect member and a conductive member formed within the dielectric material. A through-silicon-via (TSV) structure is formed laterally offset from the interconnect structure by forming a first portion of the TSV structure with a first conductive material and forming a second portion of the TSV structure with a second conductive material. Forming the second portion of the TSV structure occurs substantially simultaneously with forming one of the interconnect features.

20 Claims, 7 Drawing Sheets

(56) References Cited

U.S. PATENT DOCUMENTS

| | | |
|---|---|---|
| 8,772,945 B2 | 7/2014 | Lin et al. |
| 8,803,292 B2 * | 8/2014 | Chen et al. ............... 257/621 |
| 2008/0211098 A1 | 9/2008 | Suzuki et al. |
| 2010/0084747 A1 * | 4/2010 | Chen .................. H01L 21/6835 257/621 |
| 2011/0068466 A1 * | 3/2011 | Chen ................. H01L 21/76898 257/737 |
| 2011/0193199 A1 * | 8/2011 | Filippi ............. H01L 21/76898 257/621 |
| 2011/0193226 A1 * | 8/2011 | Kirby ............... H01L 21/76898 257/738 |
| 2011/0316169 A1 | 12/2011 | Sunohara et al. |
| 2012/0112322 A1 * | 5/2012 | Lin ................... H01L 21/76898 257/618 |
| 2012/0133030 A1 | 5/2012 | Wang et al. |
| 2012/0276736 A1 * | 11/2012 | Idani ................ H01L 21/76816 438/642 |
| 2013/0098665 A1 | 4/2013 | Ishii et al. |
| 2013/0119547 A1 * | 5/2013 | Kim ..................... H01L 23/481 257/751 |
| 2013/0175689 A1 | 7/2013 | Chuang et al. |
| 2013/0285125 A1 * | 10/2013 | Chen ...................... H01L 24/13 257/288 |
| 2014/0021633 A1 | 1/2014 | Lee et al. |
| 2014/0084473 A1 | 3/2014 | Moon et al. |
| 2014/0138848 A1 * | 5/2014 | Matsuura ............. H01L 23/481 257/774 |
| 2014/0287581 A1 | 9/2014 | Lin et al. |
| 2015/0054174 A1 | 2/2015 | Lo et al. |
| 2015/0061115 A1 | 3/2015 | Chen et al. |

\* cited by examiner

ROBUST THROUGH-SILICON-VIA STRUCTURE

BACKGROUND

Two semiconductor wafers, dies, and/or other substrates may be assembled utilizing through-silicon-via (TSV) structures that extend through the thickness of the substrate. However, as such devices continue to decrease in size, lower metallization layers of the included interconnect structures are evolving from single-damascene to dual-damascene structures. This evolution, however, renders the TSV structure susceptible to popping up, due at least in part to the elimination of the metal pad that previously covered the TSV structure. Moreover, the additional manufacturing steps that would be required to reintroduce the metal pad covering the TSV structure would excessively drive up complexity and device cost while potentially decreasing product yield.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
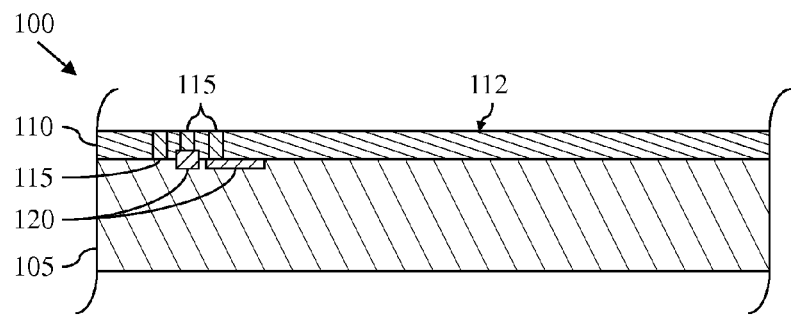
FIG. 1 is a sectional view of at least a portion of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is schematic view of at least a portion of an apparatus 100 in an intermediate stage of manufacture according to one or more aspects of the present disclosure. The apparatus 100 is fabricated from and/or on a substrate 105, which may comprise bulk silicon, strained silicon, silicon germanium, and/or other materials. The substrate 105 may also be or comprise a silicon-on-insulator (SOI) substrate, such as a silicon-on-sapphire substrate, a silicon germanium-on-insulator substrate, and/or another substrate comprising an epitaxial semiconductor layer on an insulator layer. However, the substrate 105 may comprise additional or alternative materials within the scope of the present disclosure. The substrate 105 may have a <100>, <110>, <111>, or other surface orientation. The substrate 105 may also comprise at least portions of one or more active and/or passive devices (not shown), such as transistors, capacitors, resistors, inductors, and/or other devices that may be utilized to generate the desired structural and functional requirements of the design. Such devices may be formed by any suitable methods, whether within and/or on the surface of the substrate 105.

The apparatus 100 also comprises an interlayer dielectric (ILD) layer 110 overlying at least portions of the substrate 105. The ILD layer 110 may comprise one or more layers of silicon oxide, BLACK DIAMOND (a product of Applied Materials of Santa Clara, Calif.), and/or other materials, which may be formed by chemical-vapor deposition (CVD), sputtering, spin-on coating, and/or other processes. The thickness of the ILD layer 110 may range between about 1500 angstroms and about 8000 angstroms, although other thicknesses are also within the scope of the present disclosure.

The apparatus 100 also comprises one or more conductive members 115 extending through the thickness of the ILD layer 110. The conductive members 115 may be formed in openings that are defined in the ILD layer 110 by applying and developing a suitable photoresist (not shown), and then etching the ILD layer 115 to generate the openings. The openings for the conductive members 115 may be partially or substantially lined with a barrier layer (not shown) prior to formation of the conductive members 115. The barrier layer may comprise one or more layers of conductive and/or dielectric materials, such as titanium, titanium nitride, tantalum nitride, titanium, silicon nitride, silicon oxide, and/or other materials, which may be formed utilizing CVD, plasma-enhanced CVD (PECVD), metal organic CVD (MOCVD), sputtering, and/or other processes.

The conductive material forming the conductive members 115 may comprise copper, aluminum, doped polysilicon, combinations thereof, and/or other materials, and may be formed by various CVD processes, perhaps including depositing a seed layer and then electroplating copper onto the seed layer. Grinding, chemical mechanical planarizing (CMP), and/or other processes may then be utilized to remove a portion of the conductive material to define the conductive members 115 flush with the upper surface 112 of the ILD layer 110.

The conductive members 115 may each extend through the ILD layer 110 to the substrate 105 and/or to a corresponding feature 120 formed on and/or in the substrate 105. For example, the feature 120 may comprise a landing pad, a bond pad, a trace, a contact of one or more active and/or passive devices, and/or other conductive elements.

Figure 2:
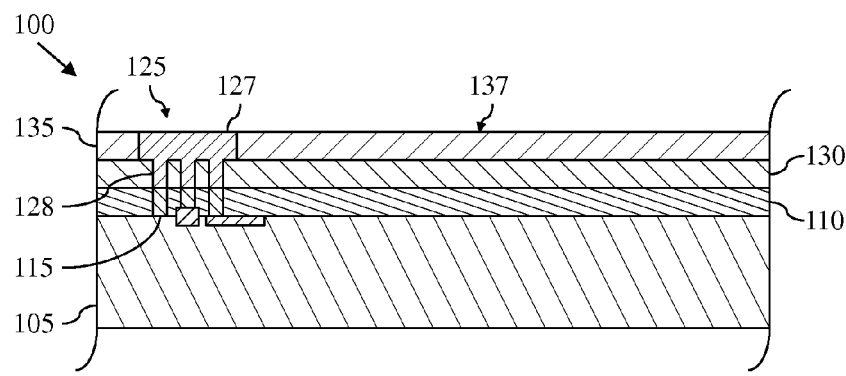
FIG. 2 is a sectional view of the apparatus shown in FIG. 1 in a subsequent stage of manufacture according to one or more aspects of the present disclosure.

FIG. 2 is a cross-sectional view of a portion of the apparatus 100 shown in FIG. 1 in a subsequent stage of manufacture, in which a portion of an interconnect structure 125 has been formed in a first inter-metal dielectric (IMD) layer 130 and a second IMD layer 135. The interconnect structure 125 may comprise an interconnect member 127 extending through the second IMD layer 135 and a plurality of vias 128 extending through the first IMD layer 130 between the interconnect member 127 and one or more of the conductive members 115.

The first and second IMD layers 130 and 135 may each comprise one or more layers of silicon oxide, BLACK DIAMOND, and/or other materials, which may be formed by CVD, sputtering, spin-on coating, and/or other processes. The first and second IMD layers 130 and 135 may each have a thickness ranging between about 1500 angstroms and about 8000 angstroms, although other thicknesses are also within the scope of the present disclosure.

The interconnect member 127 and vias 128 may be formed in openings that are defined in the first and second IMD layers 130 and 135 by applying and developing one or more suitable photoresist layers (not shown), and then etching the first and second IMD layers 130 and 135 to generate the openings. The openings may be partially or substantially lined with a barrier layer (not shown) prior to formation of the interconnect member 127 and/or vias 128. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the interconnect member 127 and vias 128 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the interconnect member 127 flush with the upper surface 137 of the second IMD layer 135.

The interconnect member 127 and vias 128 are depicted in FIG. 2 as being the result of a dual-damascene process, such that the vias 128 are formed integral to the interconnect member 127. However, in other implementations within the scope of the present disclosure, the interconnect member 127 may be a discrete member, formed separate from the vias 128, yet still in electrical communication with the vias 128 via direct contact and/or one or more intervening layers.

Figure 3:
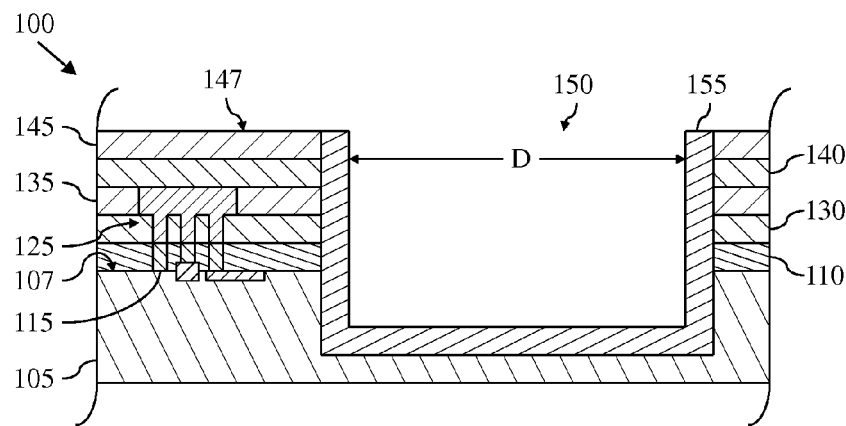
FIG. 3 is a sectional view of the apparatus shown in FIG. 2 in a subsequent stage of manufacture according to one or more aspects of the present disclosure.

FIG. 3 is a cross-sectional view of a portion of the apparatus 100 shown in FIG. 2 in a subsequent stage of manufacture, in which a third IMD layer 140 and a fourth IMD layer 145 have been formed over the existing layers, and a through-silicon-via (TSV) opening 150 has been formed. The third and fourth IMD layers 140 and 145 may each comprise one or more layers of silicon oxide, BLACK DIAMOND, and/or other materials, which may be formed by CVD, sputtering, spin-on coating, and/or other processes. The third and fourth IMD layers 140 and 145 may each have a thickness ranging between about 1500 angstroms and about 8000 angstroms, although other thicknesses are also within the scope of the present disclosure.

The TSV opening 150 may be formed by applying and developing a suitable photoresist (not shown), and then etching to generate the TSV opening 150. The TSV opening 150 may extend into the substrate 105, perhaps at least further than any active and/or devices (not shown) formed in the substrate 105 and/or to a depth at least greater than the eventual desired height of the finished semiconductor die. While the depth is dependent upon the overall design of the semiconductor die, the depth may range between about 1 micron and about 700 microns below the surface 107 of the substrate 105, such as to a depth of about 50 microns. The TSV opening 150 may have a diameter D ranging between about 1 micron and about 100 microns, such as a diameter of about 12 microns.

At least portions of the internal surfaces of the TSV opening 150 may be lined with a TSV liner 155 comprising one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes. Grinding, CMP, and/or other processes may then be utilized to remove a portion of the TSV liner 155 to, for example, be flush with the surface 147 of the fourth IMD layer 145.

Figure 4:
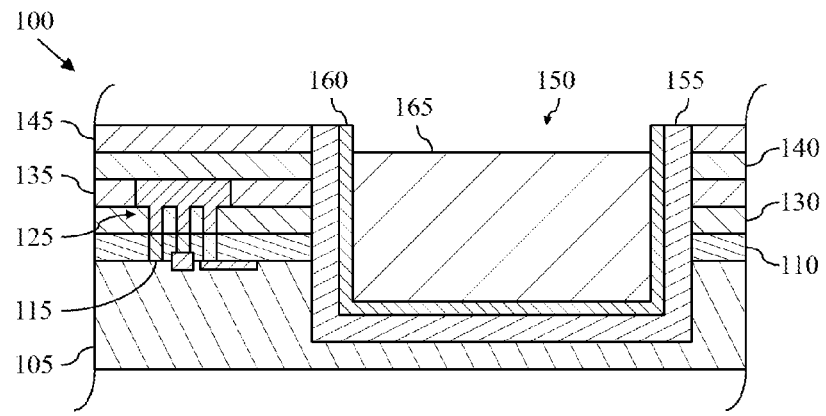
FIG. 4 is a sectional view of the apparatus shown in FIG. 3 in a subsequent stage of manufacture according to one or more aspects of the present disclosure.

FIG. 4 is a cross-sectional view of a portion of the apparatus 100 shown in FIG. 3 in a subsequent stage of manufacture, in which the TSV opening 150 has been at least partially lined with a TSV barrier layer 160, and a first portion of the TSV opening 150 has subsequently been filled with a first conductive material 165. The TSV barrier layer 160 may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes. Grinding, CMP, and/or other processes may be utilized to remove a portion of the TSV barrier layer 160.

The first conductive material 165 may comprise copper, aluminum, doped polysilicon, combinations thereof, and/or other materials, and may be formed by depositing a seed layer and then electroplating copper onto the seed layer, among other deposition processes. As described above, only a portion of the TSV opening 150 is filled with the first conductive material 165. The remaining portion of the TSV opening 150 will be filled with a second conductive material substantially simultaneously with the formation of metallic features formed in the third and fourth IMD layers 140 and 145. Thus, the upper surface of the first conductive material 165 may be about parallel or coplanar with the upper or lower surfaces of the third or fourth IMD layers 140 and 145, respectively.

Figure 5:
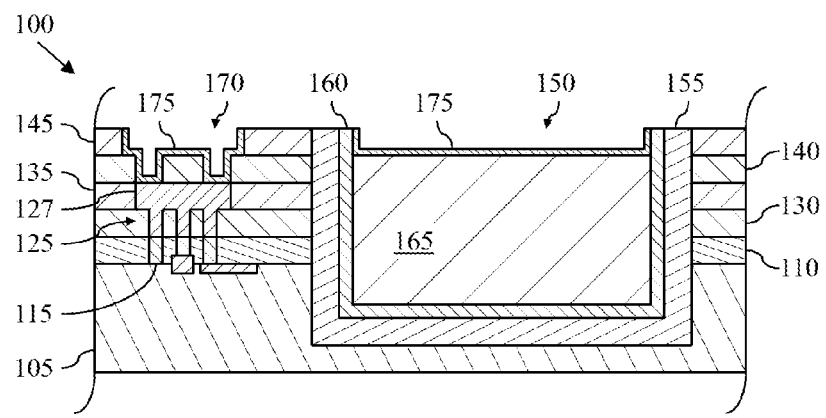
FIG. 5 is a sectional view of the apparatus shown in FIG. 4 in a subsequent stage of manufacture according to one or more aspects of the present disclosure.

FIG. 5 is a cross-sectional view of a portion of the apparatus 100 shown in FIG. 4 in a subsequent stage of manufacture, in which openings 170 corresponding to an additional portion of the interconnect structure 125 have been formed in the third and fourth IMD layers 140 and 145, and a metallization barrier layer 175 at least partially lines interior surfaces of the openings 170 and the remaining, unfilled portion of the TSV opening 150. The openings 170 may be defined in the third and fourth IMD layers 140 and 145 by applying and developing one or more suitable photoresist layers (not shown), and then etching the third and fourth IMD layers 140 and 145 to generate the openings 170. The openings 170 may extend to, expose, and/or "land on" the previously formed interconnect member 127 of the interconnect structure 125.

The metallization barrier layer 175 may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes. Grinding, CMP, and/or other processes may be utilized to remove a portion of the metallization barrier layer 175.

Figure 6:
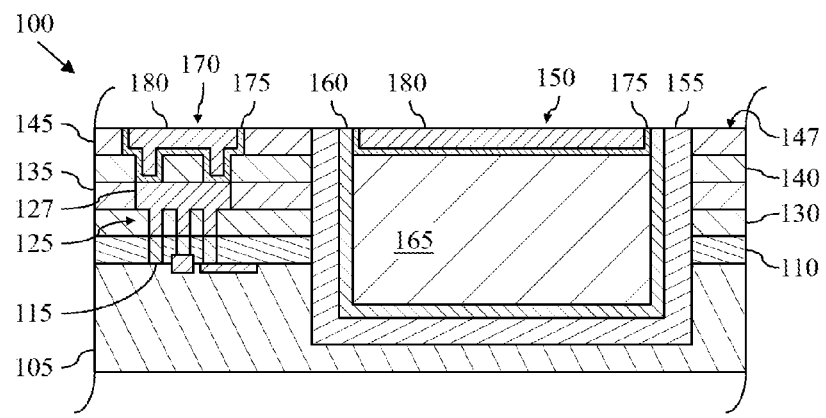
FIG. 6 is a sectional view of the apparatus shown in FIG. 5 in a subsequent stage of manufacture according to one or more aspects of the present disclosure.

FIG. 6 is a cross-sectional view of a portion of the apparatus 100 shown in FIG. 5 in a subsequent stage of manufacture, in which a second conductive material 180 has been deposited in the openings 170 and the remaining unfilled portion of the TSV opening 150, thus substantially simultaneously forming an interconnect member in the openings 170 and completing the TSV structure in the TSV opening 150. The second conductive material 180 may be substantially similar to the first conductive material 165, such that the first and second conductive materials 165 and 180 may be characterized by a common aspect resulting from being formed substantially simultaneously. For example, the first and second conductive materials 165 and 180 may have substantially the same material composition. Similarly, the first and second conductive materials 165 and 180 may have substantially similar crystal structures, hardnesses, and/or densities. Other common aspects of the first and second conductive materials 165 and 180 may include one or more of atomic mass/number/weight, compression, ductility, elasticity, electrical conductivity, etchant selectivity, malleability, magnetic flux, tension, and/or thermal conductivity, among others.

The second conductive material 180 may be or comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the second conductive material 180 to be flush with the upper surface 147 of the fourth IMD layer 145.

The interconnect member and vias formed by the second conductive material 180 are depicted in FIG. 6 as being the result of a dual-damascene process, such that the vias are formed integral to the interconnect member. However, in other implementations within the scope of the present disclosure, the interconnect member may be a discrete member, formed separate from the vias, yet still in electrical communication with the vias via direct contact and/or one or more intervening layers.

Figure 7:
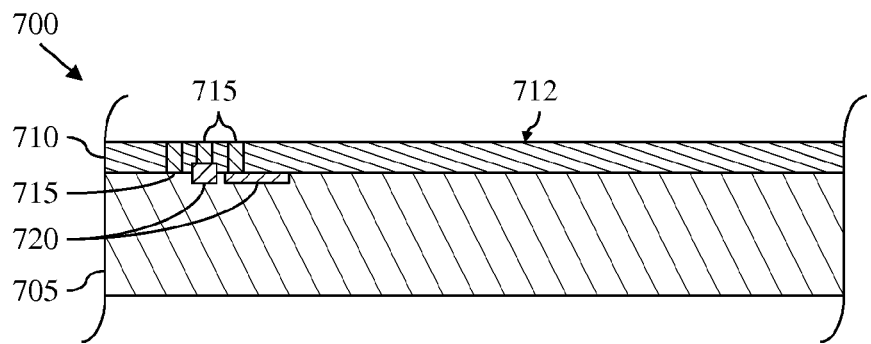
FIG. 7 is a sectional view of at least a portion of apparatus according to one or more aspects of the present disclosure.

FIG. 7 is schematic view of at least a portion of an apparatus 700 in an intermediate stage of manufacture according to one or more aspects of the present disclosure. The apparatus 700 is fabricated from and/or on a substrate 705, which may comprise bulk silicon, strained silicon, silicon germanium, and/or other materials. The substrate 705 may also be or comprise a silicon-on-insulator (SOI) substrate, such as a silicon-on-sapphire substrate, a silicon germanium-on-insulator substrate, and/or another substrate comprising an epitaxial semiconductor layer on an insulator layer. However, the substrate 705 may comprise additional or alternative materials within the scope of the present disclosure. The substrate 705 may have a <100>, <110>, <111>, or other surface orientation. The substrate 705 may also comprise at least portions of one or more active and/or passive devices (not shown), such as transistors, capacitors, resistors, inductors, and/or other devices that may be utilized to generate the desired structural and functional requirements of the design. Such devices may be formed by any suitable methods, whether within and/or on the surface of the substrate 705.

The apparatus 700 also comprises an interlayer dielectric (ILD) layer 710 overlying at least portions of the substrate 705. The ILD layer 710 may comprise one or more layers of silicon oxide, BLACK DIAMOND (a product of Applied Materials of Santa Clara, Calif.), and/or other materials, which may be formed by CVD, sputtering, spin-on coating, and/or other processes. The thickness of the ILD layer 710 may range between about 1500 angstroms and about 8000 angstroms, although other thicknesses are also within the scope of the present disclosure.

The apparatus 700 also comprises one or more conductive members 715 extending through the thickness of the ILD layer 710. The conductive members 715 may be formed in openings that are defined in the ILD layer 710 by applying and developing a suitable photoresist (not shown), and then etching the ILD layer 715 to generate the openings. The openings for the conductive members 715 may be partially or substantially lined with a barrier layer (not shown) prior to formation of the conductive members 715. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the conductive members 715 may comprise copper, aluminum, doped polysilicon, combinations thereof, and/or other materials, and may be formed by various CVD processes, perhaps including depositing a seed layer and then electroplating copper onto the seed layer. Grinding, chemical mechanical planarizing (CMP), and/or other processes may then be utilized to remove a portion of the conductive material to define the conductive members 715 flush with the upper surface 712 of the ILD layer 710.

The conductive members 715 may each extend through the ILD layer 710 to the substrate 705 and/or to a corresponding feature 720 formed on and/or in the substrate 705. For example, the feature 720 may comprise a landing pad, a bond pad, a trace, a contact of one or more active and/or passive devices, and/or other conductive elements.

Figure 8:
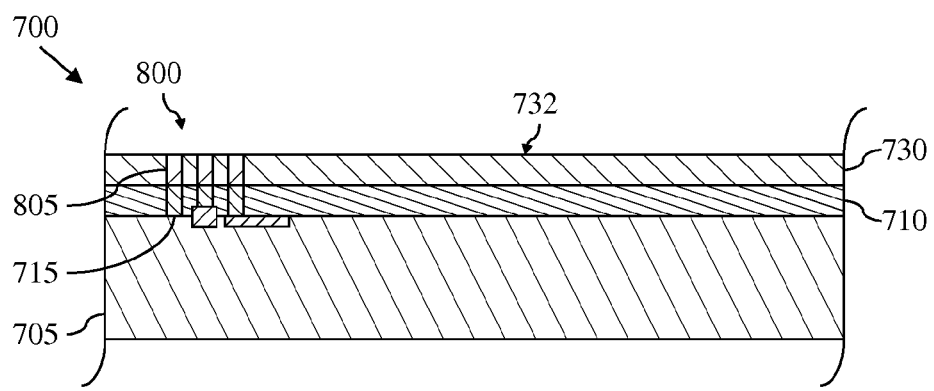
FIG. 8 is a sectional view of the apparatus shown in FIG. 7 in a subsequent stage of manufacture according to one or more aspects of the present disclosure.

FIG. 8 is a cross-sectional view of a portion of the apparatus 700 shown in FIG. 7 in a subsequent stage of manufacture, in which a portion of an interconnect structure 800 has been formed in a first IMD layer 730. The interconnect structure 800 may comprise a plurality of vias 805 extending through the first IMD layer 730 to one or more of the conductive members 715.

The first IMD layer 730 may comprise one or more layers of silicon oxide, BLACK DIAMOND, and/or other materials, which may be formed by CVD, sputtering, spin-on coating, and/or other processes. The first IMD layer 730 may have a thickness ranging between about 1500 angstroms and about 8000 angstroms, although other thicknesses are also within the scope of the present disclosure.

The vias 805 may be formed in openings that are defined in the first IMD layer 730 by applying and developing one or more suitable photoresist layers (not shown), and then etching the first IMD layer 730 to generate the openings. The openings may be partially or substantially lined with a barrier layer (not shown) prior to formation of the vias 805. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the vias 805 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the vias 805 flush with the upper surface 732 of the first IMD layer 730.

Figure 9:
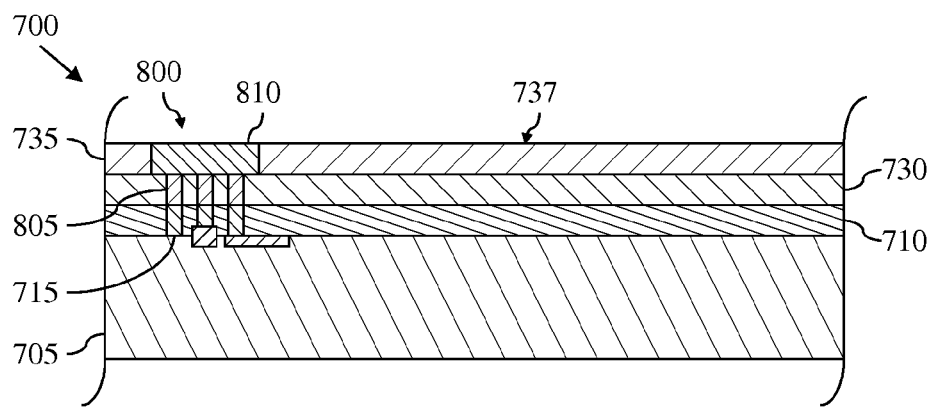
FIG. 9 is a sectional view of the apparatus shown in FIG. 8 in a subsequent stage of manufacture according to one or more aspects of the present disclosure.

FIG. 9 is a cross-sectional view of a portion of the apparatus 700 shown in FIG. 8 in a subsequent stage of manufacture, in which another portion of the interconnect structure 800 has been formed in a second IMD layer 735. For example, the interconnect structure 800 may comprise an interconnect member 810 extending through the second IMD layer 735 to the plurality of vias 805 that extend through the first IMD layer 730.

The second IMD layer 735 may comprise one or more layers of silicon oxide, BLACK DIAMOND, and/or other materials, which may be formed by CVD, sputtering, spin-on coating, and/or other processes. The second IMD layer 735 may have a thickness ranging between about 1500 angstroms and about 8000 angstroms, although other thicknesses are also within the scope of the present disclosure.

The interconnect member 810 may be formed in an opening that is defined in the second IMD layer 735 by applying and developing one or more suitable photoresist layers (not shown), and then etching the second IMD layer 735 to generate the opening. The opening may be partially or substantially lined with a barrier layer (not shown) prior to formation of the interconnect member 810. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the interconnect member 810 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the interconnect member 810 flush with the upper surface 737 of the second IMD layer 735.

Figure 10:
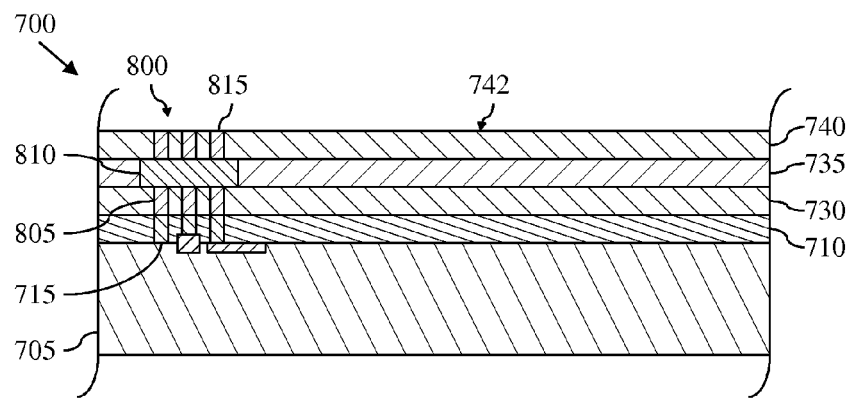
FIG. 10 is a sectional view of the apparatus shown in FIG. 9 in a subsequent stage of manufacture according to one or more aspects of the present disclosure.

FIG. 10 is a cross-sectional view of a portion of the apparatus 700 shown in FIG. 9 in a subsequent stage of manufacture, in which another portion of the interconnect structure 800 has been formed in a third IMD layer 740. For example, the interconnect structure 800 may comprise another plurality of vias 815 extending through the third IMD layer 740 to the underlying conductive member 810.

The third IMD layer 740 may comprise one or more layers of silicon oxide, BLACK DIAMOND, and/or other materials, which may be formed by CVD, sputtering, spin-on coating, and/or other processes. The third IMD layer 740 may have a thickness ranging between about 1500 angstroms and about 8000 angstroms, although other thicknesses are also within the scope of the present disclosure.

The vias 815 may be formed in openings that are defined in the third IMD layer 740 by applying and developing one or more suitable photoresist layers (not shown), and then etching the third IMD layer 740 to generate the openings. The openings may be partially or substantially lined with a barrier layer (not shown) prior to formation of the vias 815. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the vias 815 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the vias 738 flush with the upper surface 742 of the third IMD layer 740.

Figure 11:
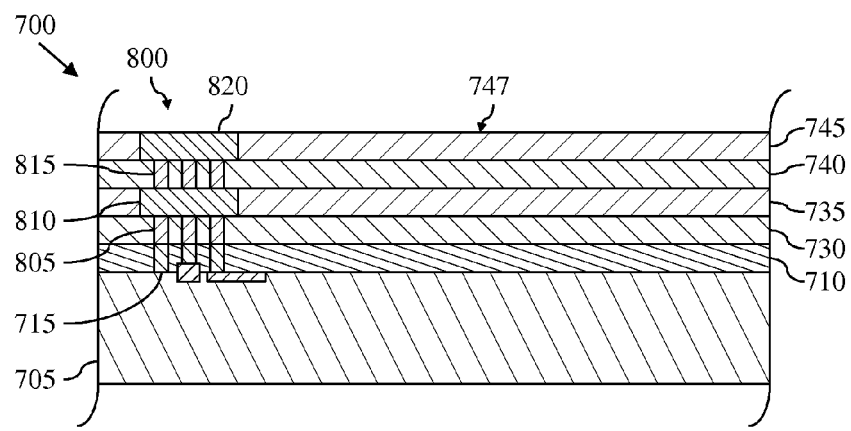
FIG. 11 is a sectional view of the apparatus shown in FIG. 10 in a subsequent stage of manufacture according to one or more aspects of the present disclosure.

FIG. 11 is a cross-sectional view of a portion of the apparatus 700 shown in FIG. 10 in a subsequent stage of manufacture, in which another portion of the interconnect structure 800 has been formed in a fourth IMD layer 745. For example, the interconnect structure 800 may comprise an interconnect member 820 extending through the fourth IMD layer 745 to the plurality of vias 815 that extend through the third IMD layer 740.

The fourth IMD layer 745 may comprise one or more layers of silicon oxide, BLACK DIAMOND, and/or other materials, which may be formed by CVD, sputtering, spin-on coating, and/or other processes. The fourth IMD layer 745 may have a thickness ranging between about 1500 angstroms and about 8000 angstroms, although other thicknesses are also within the scope of the present disclosure.

The interconnect member 820 may be formed in an opening that is defined in the fourth IMD layer 745 by applying and developing one or more suitable photoresist layers (not shown), and then etching the fourth IMD layer 745 to generate the opening. The opening may be partially or substantially lined with a barrier layer (not shown) prior to formation of the interconnect member 820. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the interconnect member 820 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the interconnect member 820 flush with the upper surface 747 of the fourth IMD layer 745.

Figure 12:
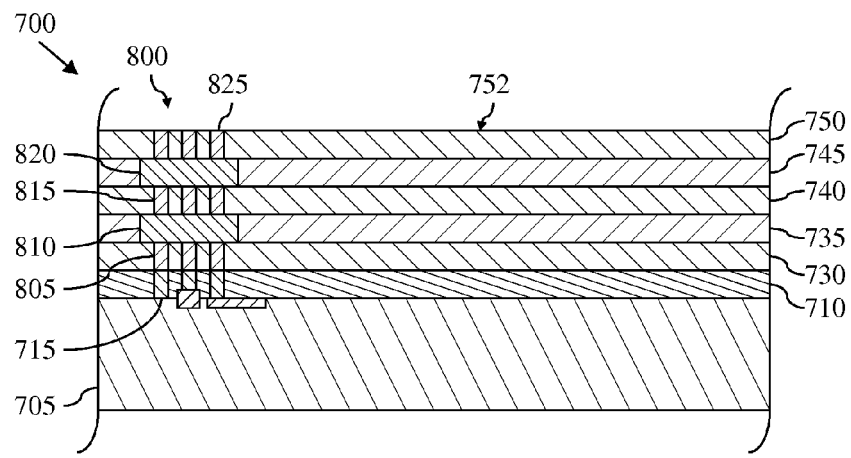
FIG. 12 is a sectional view of the apparatus shown in FIG. 11 in a subsequent stage of manufacture according to one or more aspects of the present disclosure.

FIG. 12 is a cross-sectional view of a portion of the apparatus 700 shown in FIG. 11 in a subsequent stage of manufacture, in which another portion of the interconnect structure 800 has been formed in a fifth IMD layer 750. For example, the interconnect structure 800 may comprise additional vias 825 extending through the fifth IMD layer 750 to one or more of the underlying conductive members 820.

The fifth IMD layer 750 may comprise one or more layers of silicon oxide, BLACK DIAMOND, and/or other materials, which may be formed by CVD, sputtering, spin-on coating, and/or other processes. The fifth IMD layer 750 may have a thickness ranging between about 1500 angstroms and about 8000 angstroms, although other thicknesses are also within the scope of the present disclosure.

The vias 825 may be formed in openings that are defined in the fifth IMD layer 750 by applying and developing one or more suitable photoresist layers (not shown), and then etching the fifth IMD layer 750 to generate the openings. The openings may be partially or substantially lined with a barrier layer (not shown) prior to formation of the vias 825. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the vias 825 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the vias 825 flush with the upper surface 752 of the fifth IMD layer 750.

Figure 13:
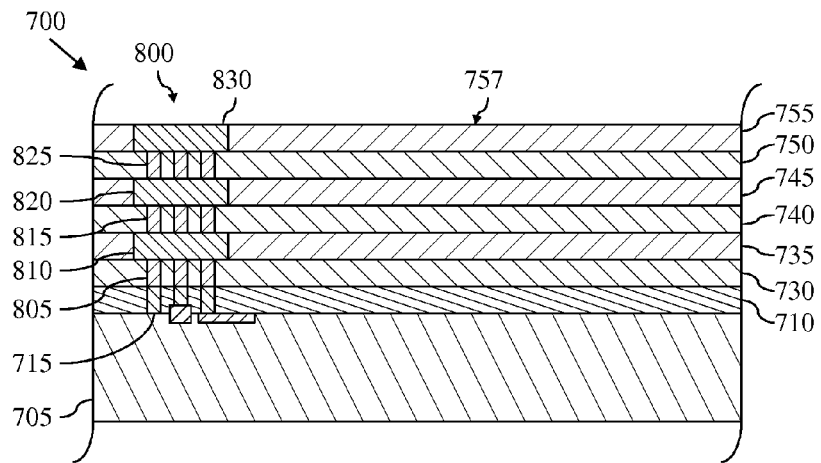
FIG. 13 is a sectional view of the apparatus shown in FIG. 12 in a subsequent stage of manufacture according to one or more aspects of the present disclosure.

FIG. 13 is a cross-sectional view of a portion of the apparatus 700 shown in FIG. 12 in a subsequent stage of manufacture, in which another portion of the interconnect structure 800 has been formed in a sixth IMD layer 755. For example, the interconnect structure 800 may comprise an interconnect member 830 extending through the sixth IMD layer 755 to the plurality of vias 825 that extend through the fifth IMD layer 750.

The sixth IMD layer 755 may comprise one or more layers of silicon oxide, BLACK DIAMOND, and/or other materials, which may be formed by CVD, sputtering, spin-on coating, and/or other processes. The sixth IMD layer 755 may have a thickness ranging between about 1500 angstroms and about 8000 angstroms, although other thicknesses are also within the scope of the present disclosure.

The interconnect member 830 may be formed in an opening that is defined in the sixth IMD layer 755 by applying and developing one or more suitable photoresist layers (not shown), and then etching the sixth IMD layer 755 to generate the opening. The opening may be partially or substantially lined with a barrier layer (not shown) prior to formation of the interconnect member 830. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the interconnect member 830 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the interconnect member 830 flush with the upper surface 757 of the sixth IMD layer 755.

Figure 14:
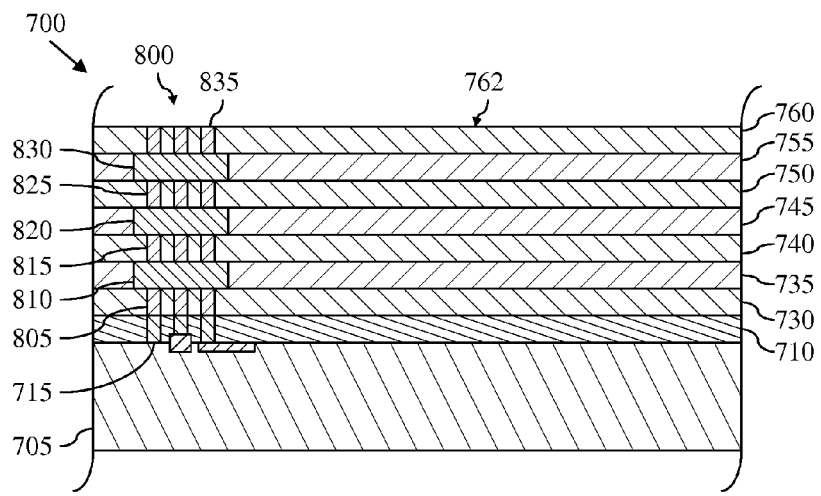
FIG. 14 is a sectional view of the apparatus shown in FIG. 13 in a subsequent stage of manufacture according to one or more aspects of the present disclosure.

FIG. 14 is a cross-sectional view of a portion of the apparatus 700 shown in FIG. 13 in a subsequent stage of manufacture, in which another portion of the interconnect structure 800 has been formed in a seventh IMD layer 760. For example, the interconnect structure 800 may comprise additional vias 835 extending through the seventh IMD layer 760 to one or more of the underlying conductive members 830.

The seventh IMD layer 760 may comprise one or more layers of silicon oxide, BLACK DIAMOND, and/or other materials, which may be formed by CVD, sputtering, spin-on coating, and/or other processes. The seventh IMD layer 760 may have a thickness ranging between about 1500 angstroms and about 8000 angstroms, although other thicknesses are also within the scope of the present disclosure.

The vias 835 may be formed in openings that are defined in the seventh IMD layer 760 by applying and developing one or more suitable photoresist layers (not shown), and then etching the seventh IMD layer 760 to generate the openings. The openings may be partially or substantially lined with a barrier layer (not shown) prior to formation of the vias 835. The barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

The conductive material forming the vias 835 may comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the vias 835 flush with the upper surface 762 of the seventh IMD layer 760.

Figure 15:
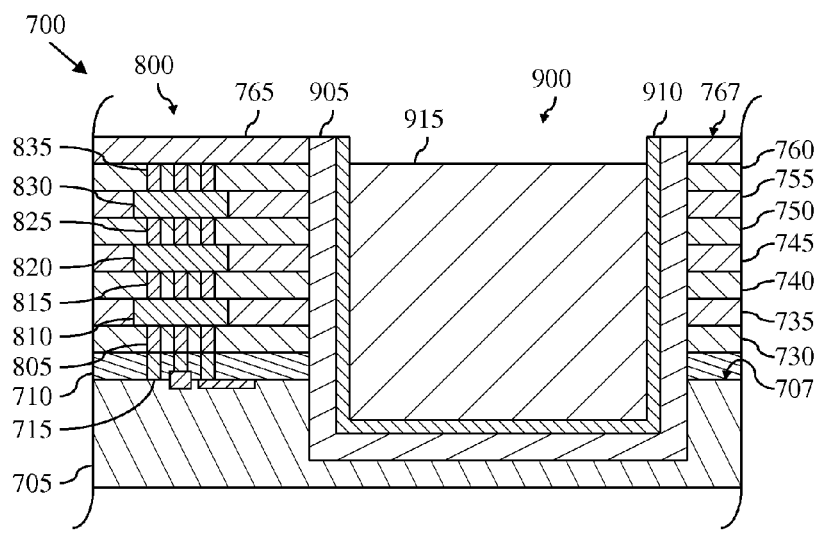
FIG. 15 is a sectional view of the apparatus shown in FIG. 14 in a subsequent stage of manufacture according to one or more aspects of the present disclosure.

FIG. 15 is a cross-sectional view of a portion of the apparatus 700 shown in FIG. 14 in a subsequent stage of manufacture, in which an eighth IMD layer 765 has been formed over the existing layers, and a TSV opening 900 has been formed. The eighth IMD layer 765 may comprise one or more layers of silicon oxide, BLACK DIAMOND, and/or other materials, which may be formed by CVD, sputtering, spin-on coating, and/or other processes, perhaps to a thickness ranging between about 1500 angstroms and about 8000 angstroms, although other thicknesses are also within the scope of the present disclosure.

The TSV opening 900 may be formed by applying and developing a suitable photoresist (not shown), and then etching to generate the TSV opening 150. The TSV opening 900 may extend into the substrate 705, perhaps at least further than any active and/or devices (not shown) formed in the substrate 705 and/or to a depth at least greater than the eventual desired height of the finished semiconductor die. While the depth is dependent upon the overall design of the semiconductor die, the depth may range between about 1 micron and about 700 microns below the surface 707 of the substrate 705, such as to a depth of about 50 microns. The TSV opening 900 may have a diameter ranging between about 1 micron and about 100 microns, such as a diameter of about 12 microns.

At least portions of the internal surfaces of the TSV opening 900 may be lined with a TSV liner 905 comprising one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes. Grinding, CMP, and/or other processes may then be utilized to remove a portion of the TSV liner 905 to, for example, be flush with the surface 767 of the eighth IMD layer 765.

The apparatus 700 may comprise a TSV barrier layer 910 at least partially covering the internal surfaces of the TSV liner 905. A first portion of the TSV opening 900 may then be filled with a first conductive material 915. The TSV barrier layer 910 may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes. Grinding, CMP, and/or other processes may be utilized to remove a portion of the TSV barrier layer 910.

The first conductive material 915 may comprise copper, aluminum, doped polysilicon, combinations thereof, and/or other materials, and may be formed by depositing a seed layer and then electroplating copper onto the seed layer, among other deposition processes. As described above, only a portion of the TSV opening 900 is filled with the first conductive material 915. The remaining portion of the TSV opening goo will be filled with a second conductive material substantially simultaneously with the formation of metallic features formed in the eighth IMD layer 765. Thus, the upper surface of the first conductive material 915 may be about parallel or coplanar with the upper or lower surfaces of the seventh or eighth IMD layers 760 and 765, respectively.

Figure 16:
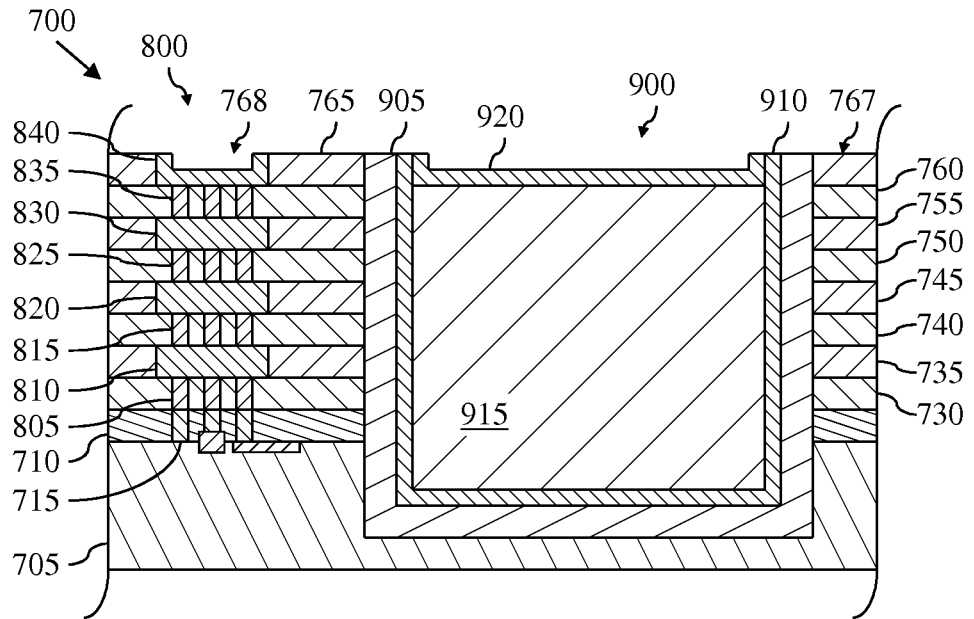
FIG. 16 is a sectional view of the apparatus shown in FIG. 15 in a subsequent stage of manufacture according to one or more aspects of the present disclosure.

FIG. 16 is a cross-sectional view of a portion of the apparatus 700 shown in FIG. 15 in a subsequent stage of manufacture, in which an opening 768 corresponding to an additional portion of the interconnect structure 800 has been formed in the eighth IMD layer 765, and metallization barrier layers 840 and 920 at least partially line interior surfaces of the opening 768 and the remaining, unfilled portion of the TSV opening 900. The opening 768 may be defined in the eighth IMD layer 765 by applying and developing one or more suitable photoresist layers (not shown), and then etching the eighth IMD layer 765 to generate the opening 768. The opening 768 may extend to, expose, and/or "land on" one or more of the previously formed vias 835 of the interconnect structure 800.

The metallization barrier layers 840 and 920 may each comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes. Grinding, CMP, and/or other processes may be utilized to remove a portion of metallization barrier layers 840 and 920 so that they are substantially flush with the surface 767 of the eighth IMD layer 765.

Figure 17:
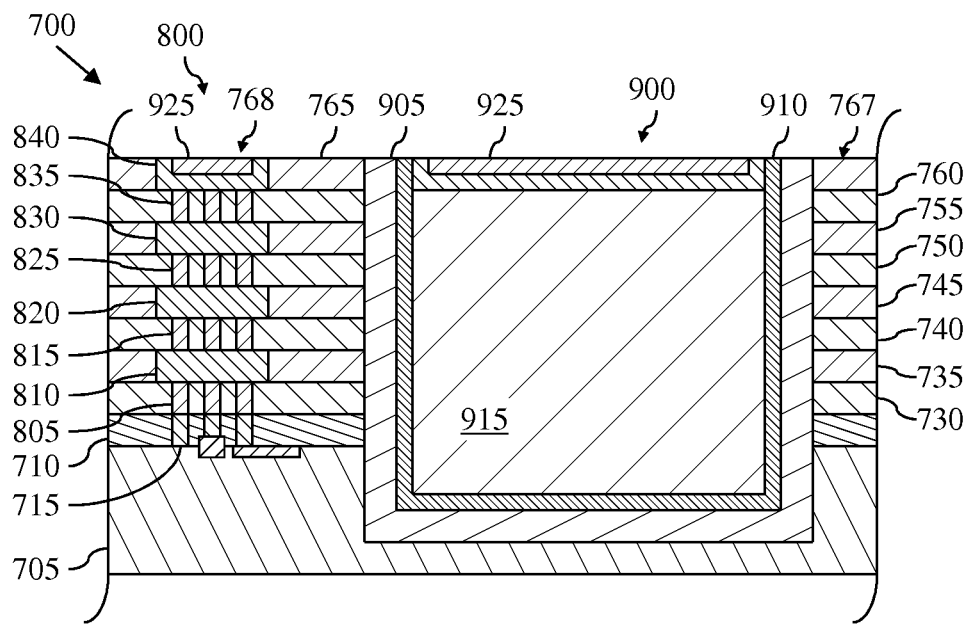
FIG. 17 is a sectional view of the apparatus shown in FIG. 16 in a subsequent stage of manufacture according to one or more aspects of the present disclosure.

FIG. 17 is a cross-sectional view of a portion of the apparatus 700 shown in FIG. 16 in a subsequent stage of manufacture, in which a second conductive material 925 has been deposited in the opening 768 and the remaining unfilled portion of the TSV opening 900, thus substantially simultaneously forming an interconnect member in the opening 768 and completing the TSV structure in the TSV opening 900. The second conductive material 925 may be substantially similar to the first conductive material 915, such that the first and second conductive materials 915 and 925 may be characterized by a common aspect resulting from being formed substantially simultaneously. For example, the first and second conductive materials 915 and 925 may have substantially the same material composition. Similarly, the first and second conductive materials 915 and 925 may have substantially similar crystal structures, hardnesses, and/or densities. Other common aspects of the first and second conductive materials 915 and 925 may include one or more of atomic mass/number/weight, compression, ductility, elasticity, electrical conductivity, etchant selectivity, malleability, magnetic flux, tension, and/or thermal conductivity, among others.

The second conductive material 925 may be or comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the second conductive material 925 to be flush with the upper surface 767 of the eighth IMD layer 765.

As described above, the second conductive material 180 utilized to complete the TSV structure in the implementation depicted in FIGS. 1-6 may be deposited substantially simultaneously with the metallization utilized to form the second dual-damascene structure within the third and fourth IMD layers 140 and 145. Similarly, the second conductive material 925 utilized to complete the TSV structure in the implementation depicted in FIGS. 7-17 may be deposited substantially simultaneously with the metallization utilized to form the interconnect member within the eighth IMD layer 765. However, other implementations within the scope of the present disclosure may entail depositing the upper portion of the TSV structure substantially simultaneously with any stage of metal layer. Thus, for example, the upper portion of the TSV structure may be formed substantially simultaneously with the "$N^{th}$" metal layer in implementations utilizing "X" metallization layers, wherein N and X are integers, and wherein X is equal or greater to N.

The example implementations described above include those in which the interconnect features comprise dual-damascene structures formed in dual dielectric layers separated by an etch stop layer. However, other implementations of the interconnect features within the scope of the present disclosure may also comprise dual-damascene structures formed in a single dielectric layer, with no etch stop layer, such as may be known as a timed etch process.

Figure 18:
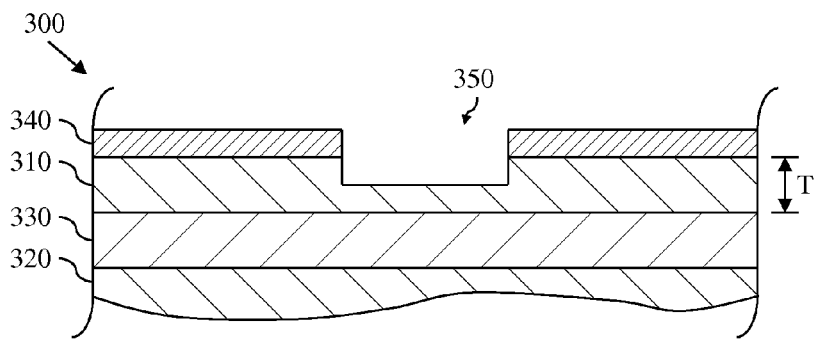
FIG. 18 is a sectional view of at least a portion of apparatus according to one or more aspects of the present disclosure.

For example, FIG. 18 is a sectional view of a portion of apparatus 300 in an intermediate stage of manufacture according to one or more aspects of the present disclosure.

The apparatus 300 may have one or more aspects in common with the apparatus 100 shown in FIGS. 1-6 and/or the apparatus 700 shown in FIGS. 7-17. The apparatus 300 includes a dielectric layer 310 in which a dual-damascene feature will be manufactured. The dielectric layer 310 may be an ILD layer, an IMD layer, and/or other layer formed over a substrate 320, perhaps with one or more intervening layers 330. The dielectric layer 310 may comprise silicon oxide, BLACK DIAMOND, and/or other materials, which may be formed by CVD, sputtering, spin-on coating, and/or other processes. The dielectric layer 310 may have a thickness ranging between about 1500 angstroms and about 8000 angstroms, although other thicknesses are also within the scope of the present disclosure.

As also depicted in FIG. 18, a first photoresist layer 340 may be utilized during a first timed etch process to remove a portion of the thickness T of the dielectric layer 310. Thus, an opening 350 may be formed in an upper (relative to the page) portion of the dielectric layer 310. The opening 350 may have lateral dimensions proportional to or otherwise corresponding to the interconnect member that will be formed therein.

Figure 19:
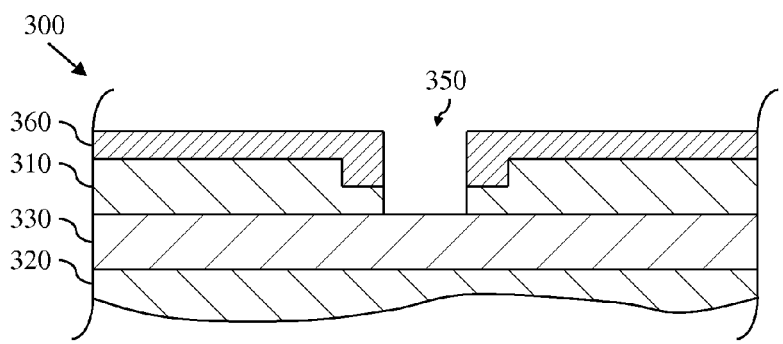
FIG. 19 is a sectional view of the apparatus shown in FIG. 18 in a subsequent stage of manufacture according to one or more aspects of the present disclosure.

FIG. 19 is a sectional view of the apparatus 300 shown in FIG. 18 in a subsequent stage of manufacture, in which a second photoresist layer 360 has been utilized during a second timed etch process to remove the remaining thickness of the dielectric layer 310. However, the second photoresist layer 360 partially fills the opening 350, such that only a portion of the opening 350 is extended to the underlying layer 330.

Figure 20:
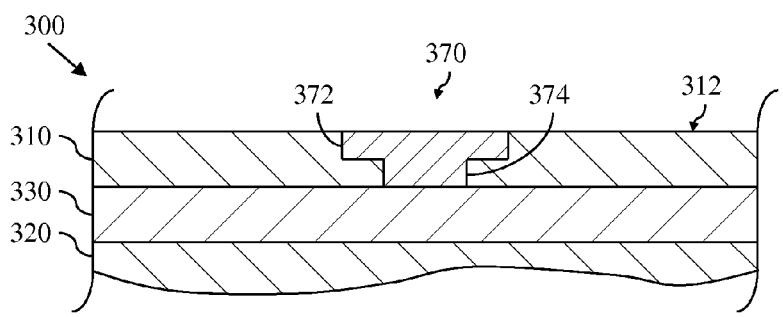
FIG. 20 is a sectional view of the apparatus shown in FIG. 19 in a subsequent stage of manufacture according to one or more aspects of the present disclosure.

FIG. 20 is a sectional view of the apparatus 300 shown in FIG. 19 in a subsequent stage of manufacture, in which the second photoresist layer 360 has been removed to reveal the stepped opening, which is then filled with a conductive material to form the dual-damascene structure 370. The dual-damascene structure 370 may form an interconnect feature substantially similar to those described above. For example, the dual-damascene structure 370 may form an interconnect feature comprising an interconnect member 372 and one or more vias 374.

The conductive material forming the dual-damascene structure 370 comprise copper, aluminum, doped polysilicon, combinations thereof, and/or other materials, and may be formed by various CVD processes, perhaps including depositing a seed layer and then electroplating copper onto the seed layer. Grinding, CMP, and/or other processes may then be utilized to remove a portion of the conductive material to define the dual-damascene structure 370 flush with the upper surface 312 of the dielectric layer 310.

The opening 350 may be partially or substantially lined with a barrier layer (not shown) prior to formation of the dual-damascene structure 370. Such barrier layer may comprise one or more layers of conductive and/or dielectric materials, such as titanium, titanium nitride, tantalum nitride, titanium, silicon nitride, silicon oxide, and/or other materials, which may be formed utilizing CVD, PECVD, MOCVD, sputtering, and/or other processes.

Figure 21:
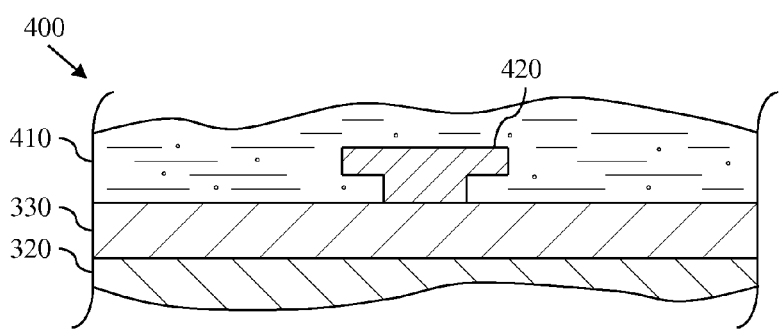
FIG. 21 is a sectional view of at least a portion of apparatus according to one or more aspects of the present disclosure.

FIG. 21 is a sectional view of a portion of apparatus 400 in an intermediate stage of manufacture according to one or more aspects of the present disclosure. The apparatus 400 may have one or more aspects in common with the apparatus 100 shown in FIGS. 1-6, the apparatus 700 shown in FIGS. 7-17, and/or the apparatus 300 shown in FIGS. 18-20. However, one or more of the metal layers of the interconnect structure described in the example implementations above may not be formed within a series of dielectric layers, but may instead be formed in other forms of dielectric material.

One such example implementation, depicted in FIG. 21, entails the utilization of a volume of dielectric gas 410 as the dielectric material in which the one or more metal layers 420 are formed. The dielectric gas may substantially comprise air, nitrogen, sulfur hexafluoride, and/or other gases able to provide electrical isolation.

In such implementations, the metal layers 420 may be formed via one or more of the processed described above, followed by a selective etching process to remove the dielectric layers. Alternatively, or additionally, the metal layers 420 may be formed via atomic layer deposition and/or other atomic- and/or molecular-level deposition techniques. Such processes may utilize various photolithography masks similar to those described above.

One skilled in the art will recognize that in the embodiments illustrated in FIGS. 18-21, a TSV structure, similar to the structure illustrated in FIGS. 1-17, can be formed laterally offset from the illustrated interconnect feature and a portion of the TSV structure can be formed substantially simultaneously with forming of the interconnect member.

In view of the entirety of the present disclosure, including the figures, a person having ordinary skill in the art will readily recognize that the present disclosure introduces a method comprising: forming an interconnect structure comprising a plurality of interconnect features disposed in dielectric material over a substrate, wherein each of the plurality of interconnect features comprises an interconnect member and a via extending between the interconnect member and a conductive member formed within the dielectric material; and forming a through-silicon-via (TSV) structure laterally offset from the interconnect structure by: forming a first portion of the TSV structure with a first conductive material; and forming a second portion of the TSV structure with a second conductive material; wherein forming the second portion of the TSV structure occurs substantially simultaneously with forming one of the plurality of interconnect features.

The dielectric material may comprise a plurality of dielectric layers formed over the substrate. At least one of the plurality of interconnect features may extend through no more than one of the plurality of dielectric layers. For at least one of the plurality of interconnect features: the interconnect member may extend through a first one of the plurality of dielectric layers; the via may extend through a second one of the plurality of dielectric layers between the interconnect member and the conductive member; and the conductive member may extend through a third one of the plurality of dielectric layers. The third one of the plurality of dielectric layers may be disposed between the substrate and the second one of the plurality of dielectric layers. The second one of the plurality of dielectric layers may be disposed between the third one of the dielectric layers and the first one of the plurality of dielectric layers. The second and third ones of the plurality of dielectric layers may be disposed between the substrate and the first one of the plurality of dielectric layers. Forming the interconnect structure may further comprise forming first and second barrier layers substantially simultaneously, including: forming the first barrier layer along internal surfaces of at least one opening defined in at least one of the plurality of dielectric layers; and forming the second barrier layer along a surface of the first conductive material.

Each interconnect member may be formed as a portion of one of a plurality of metal layers formed in the dielectric material, where the plurality of metal layers may include at least a first metal layer, a second metal layer, and a third metal layer, and the second portion of the TSV structure may be formed with the second conductive material substantially simultaneously with forming the second metal layer.

Each interconnect member may be formed as a portion of one of a plurality of metal layers formed in the dielectric material, where the plurality of metal layers may include at least a first metal layer, a second metal layer, and a third metal layer, and the second portion of the TSV structure may be formed with the second conductive material substantially simultaneously with forming one of the plurality of metal layers other than the second metal layer.

The dielectric material may substantially comprise a volume of dielectric gas. The dielectric gas may substantially comprise air.

The interconnect member and corresponding via of at least one of the plurality of interconnect features may comprise a dual-damascene structure.

The first and second conductive materials may have substantially the same composition.

Forming the TSV structure may further comprise forming a TSV liner along internal surfaces of a TSV opening prior to forming the first portion of the TSV structure within the TSV opening.

The present disclosure also introduces a method comprising: forming a first dielectric layer over a substrate; forming a plurality of electrically conductive plugs extending through the first dielectric layer; forming a second dielectric layer over the first dielectric layer and the plugs; forming a third dielectric layer over the second dielectric layer; forming a first dual-damascene structure comprising: a first interconnect extending through the third dielectric layer; and a first plurality of vias extending through the second dielectric layer between the first interconnect and the plugs; forming a fourth dielectric layer over the third dielectric layer and the first interconnect; forming a fifth dielectric layer over the fourth dielectric layer; forming a second dual-damascene structure comprising: a second interconnect extending through the fifth dielectric layer; and a second plurality of vias extending through the fourth dielectric layer between the second interconnect and the first interconnect; and forming a through-silicon-via (TSV) structure laterally offset from the first and second interconnects by: forming a recess extending through the first, second, third, fourth, and fifth dielectric layers and into the substrate; filling a first portion of the recess with a first conductive material; and filling a second portion of the recess with a second conductive material; wherein forming the second portion of the recess with the second conductive materials occurs substantially simultaneously with forming one of the first and second dual-damascene structures. The first and second conductive materials may have substantially the same composition. Forming the TSV structure may further comprise forming a TSV liner along internal surfaces of the recess prior to filling the first portion of the recess with the first conductive material. Such method may further comprise forming first and second barrier layers substantially simultaneously, including: forming the first barrier layer along internal surfaces of at least one opening defined in at least one of the first, second, third, fourth, and fifth dielectric layers; and forming the second barrier layer along a surface of the first conductive material.

The present disclosure also introduces an apparatus comprising: an interconnect structure comprising a plurality of interconnect features disposed in dielectric material over a substrate, wherein each of the plurality of interconnect features comprises an interconnect member and a via extending between the interconnect member and a conductive member formed within the dielectric material; and a through-silicon-via (TSV) structure laterally offset from the interconnect structure and comprising: a first portion extending into the substrate; and a second portion; wherein the second portion of the TSV structure and at least one of the interconnect members are collectively characterized by an aspect resulting from being formed substantially simultaneously.

The dielectric material may comprise a plurality of dielectric layers. At least one of the plurality of interconnect features may extend through no more than one of the plurality of dielectric layers. For at least one of the plurality of interconnect features: the interconnect member may extend through a first one of the plurality of dielectric layers; the via may extend through a second one of the plurality of dielectric layers; and the conductive member may extend through a third one of the plurality of dielectric layers. The first portion of the TSV structure may extend through at least one of the plurality of dielectric layers, and the second portion of the TSV structure may extend from the first portion through each of the plurality of dielectric layers not penetrated by the first portion.

At least one of the plurality of interconnect features may comprise a dual-damascene structure.

The aspect may be material composition.

The TSV structure may further comprise a TSV liner disposed between the first portion and the substrate.

The interconnect structure may further comprise: a first barrier layer formed along internal surfaces of at least one opening defined in the dielectric material; and a second barrier layer between the first and second portions of the TSV structure; wherein the first and second barrier layers may be collectively characterized by an aspect resulting from being formed substantially simultaneously.

The present disclosure also introduces a method comprising: (1) forming an interconnect structure comprising a plurality of interconnect features disposed in corresponding ones of a plurality of dielectric layers formed over a substrate, wherein forming each of the plurality of interconnect features comprises: (a) forming an interconnect member extending through a first one of the plurality of dielectric layers; and (b) forming a plurality of vias within a second one of the plurality of dielectric layers and extending between the interconnect member and one or more conductive members formed within a third one of the plurality of dielectric layers; and (2) forming a through-silicon-via (TSV) structure laterally offset from the interconnect structure by: (a) forming a TSV opening; (b) filling a first portion of the TSV opening with a first conductive material; and (c) filling a second portion of the TSV opening with a second conductive material; wherein filling the second portion of the TSV opening occurs substantially simultaneously with forming one of the plurality interconnects.

At least one of the plurality of interconnect features may comprise a dual-damascene structure comprising ones of the plurality of vias formed integral to the corresponding interconnect member.

The third one of the plurality of dielectric layers may be disposed between the substrate and the second one of the plurality of dielectric layers.

The second one of the plurality of dielectric layers may be disposed between the third one of the dielectric layers and the first one of the plurality of dielectric layers.

The second and third ones of the plurality of dielectric layers may be disposed between the substrate and the first one of the plurality of dielectric layers.

The first and second conductive materials may have substantially the same composition.

A closest one of the plurality of dielectric layers, relative to the substrate, may be an interlayer dielectric layer comprising tungsten plugs.

Forming the TSV structure may further comprise forming a TSV liner along internal surfaces of the TSV opening prior to filling the first portion of the TSV opening with the first conductive material. Forming the interconnect structure may further comprise forming first and second barrier layers substantially simultaneously, including: (i) forming the first barrier layer along internal surfaces of at least one opening defined in at least one of the plurality of dielectric layers; and (ii) forming the second barrier layer along a surface of the first conductive material.

Each interconnect member may be formed as a portion of one of a plurality of metal layers formed in corresponding ones of the plurality of dielectric layers, and the plurality of metal layers may include at least a first metal layer, a second metal layer, and a third metal layer, in which case the second portion of the TSV opening may be filled with the second conductive material substantially simultaneously with forming the second metal layer.

Each interconnect member may be formed as a portion of one of a plurality of metal layers formed in corresponding ones of the plurality of dielectric layers, and the plurality of metal layers may include at least a first metal layer, a second metal layer, and a third metal layer, in which case the second portion of the TSV opening may be filled with the second conductive material substantially simultaneously with forming one of the plurality of metal layers other than the second metal layer.

The present disclosure also introduces a method comprising: (1) forming a first dielectric layer over a substrate; (2) forming a plurality of electrically conductive plugs extending through the first dielectric layer; (3) forming a second dielectric layer over the first dielectric layer and the plugs; (4) forming a third dielectric layer over the second dielectric layer; (5) forming a first dual-damascene structure comprising: (a) a first interconnect extending through the third dielectric layer; and (b) a first plurality of vias extending through the second dielectric layer between the first interconnect and the plugs; (6) forming a fourth dielectric layer over the third dielectric layer and the first interconnect; (7) forming a fifth dielectric layer over the fourth dielectric layer; (8) forming a second dual-damascene structure comprising: (a) a second interconnect extending through the fifth dielectric layer; and (b) a second plurality of vias extending through the fourth dielectric layer between the second interconnect and the first interconnect; and (9) forming a through-silicon-via (TSV) structure laterally offset from the first and second interconnects by: (a) forming a recess extending through the first, second, third, fourth, and fifth dielectric layers and into the substrate; (b) filling a first portion of the recess with a first conductive material; and (c) filling a second portion of the recess with a second conductive material; wherein forming the second portion of the recess with the second conductive materials occurs substantially simultaneously with forming one of the first and second dual-damascene structures. The first and second conductive materials may have substantially the same composition. Forming the TSV structure may further comprise forming a TSV liner along internal surfaces of the recess prior to filling the first portion of the recess with the first conductive material. The method may further comprise forming first and second barrier layers substantially simultaneously, including: (i) forming the first barrier layer along internal surfaces of at least one opening defined in at least one of the first, second, third, fourth, and fifth dielectric layers; and (ii) forming the second barrier layer along a surface of the first conductive material.

The present disclosure also introduces an apparatus comprising: (1) an interconnect structure comprising a plurality of interconnect features disposed in corresponding ones of a plurality of dielectric layers formed over a substrate, wherein each of the plurality of interconnect features comprises: (a) an interconnect member; and (b) a via extending between the interconnect member and a conductive member formed within the dielectric material; (2) a through-silicon-via (TSV) structure laterally offset from the interconnect structure and comprising: (a) a first portion extending into the substrate; and (b) a second portion; and (3) a barrier layer extending between each of the plurality of interconnect features and the dielectric material and between the first and second portions of the TSV structure.

The dielectric material may comprise a plurality of dielectric layers. At least one of the plurality of interconnect features may extend through no more than one of the plurality of dielectric layers. For at least one of the plurality of interconnect features: (1) the interconnect member may extend through a first one of the plurality of dielectric layers; (2) the via may extend through a second one of the plurality of dielectric layers; and (3) the conductive member may extend through a third one of the plurality of dielectric layers. The first portion of the TSV structure may extend through at least one of the plurality of dielectric layers, and the second portion of the TSV structure may extend from the first portion through each of the plurality of dielectric layers not penetrated by the first portion.

At least one of the plurality of interconnect features may comprise a dual-damascene structure comprising ones of the plurality of vias formed integral to the corresponding interconnect member.

The TSV structure may further comprise a TSV liner disposed between the first portion and the substrate.

The barrier layer may be formed along internal surfaces of at least one opening defined in the dielectric material.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

What is claimed is:

1. A method, comprising:
   forming an interconnect structure comprising a plurality of interconnect features disposed in a dielectric material over a substrate, wherein each of the plurality of interconnect features comprises an interconnect member and a via extending between the interconnect member and a conductive member formed within the dielectric material; and
   forming a through-silicon-via (TSV) structure laterally offset from the interconnect structure by:

forming a first portion of the TSV structure with a first conductive material;

forming a second portion of the TSV structure with a second conductive material;

forming a first barrier layer, the first barrier layer having a first portion extending along and contacting a first sidewall of the first conductive material and a second portion extending along a second sidewall of the second conductive material; and forming a second barrier layer, the second barrier layer having a third portion extending along and contacting the second sidewall of the second conductive material and a fourth portion interposed between the first conductive material and the second conductive material;

wherein the forming of the second portion of the TSV structure occurs simultaneously with forming a first interconnect feature of the plurality of interconnect features, wherein an interface between a first interconnect member of the first interconnect feature and a first via of the first interconnect feature is level with an interface between the first portion of the TSV structure and the second barrier layer.

2. The method of claim 1, wherein the dielectric material comprises a plurality of dielectric layers formed over the substrate.

3. The method of claim 2, wherein, for at least one of the plurality of interconnect features:

the interconnect member extends through a first one of the plurality of dielectric layers;

the via extends through a second one of the plurality of dielectric layers between the interconnect member and the conductive member; and the conductive member extends through a third one of the plurality of dielectric layers.

4. The method of claim 3, wherein the second and third ones of the plurality of dielectric layers are disposed between the substrate and the first one of the plurality of dielectric layers.

5. The method of claim 3, wherein the forming of the interconnect structure further comprises forming a third barrier layer along internal surfaces of at least one opening defined in at least one of the plurality of dielectric layers substantially simultaneously with forming the second barrier layer.

6. The method of claim 1, wherein each interconnect member is formed as a portion of one of a plurality of metal layers formed in the dielectric material, wherein the plurality of metal layers includes at least a first metal layer, a second metal layer, and a third metal layer, and wherein the second portion of the TSV structure is formed with the second conductive material substantially simultaneously with forming the second metal layer.

7. The method of claim 1, wherein each interconnect member is formed as a portion of one of a plurality of metal layers formed in the dielectric material, wherein the plurality of metal layers includes at least a first metal layer, a second metal layer, and a third metal layer, and wherein the second portion of the TSV structure is formed with the second conductive material substantially simultaneously with forming one of the plurality of metal layers other than the second metal layer.

8. The method of claim 1, wherein the dielectric material substantially comprises a volume of dielectric gas.

9. The method of claim 1, wherein the forming of the TSV structure further comprises forming a TSV liner along internal surfaces of a TSV opening prior to forming the first portion of the TSV structure within the TSV opening.

10. The method of claim 1, wherein the first conductive material is same as the second conductive material.

11. A method, comprising:

forming a first dielectric layer over a substrate;

forming a plurality of electrically conductive plugs extending through the first dielectric layer;

forming a second dielectric layer over the first dielectric layer and the plurality of electrically conductive plugs;

forming a third dielectric layer over the second dielectric layer;

forming a first dual-damascene structure comprising:
 a first interconnect extending through the third dielectric layer; and
 a first plurality of vias extending through the second dielectric layer between the first interconnect and the plurality of electrically conductive plugs;

forming a fourth dielectric layer over the third dielectric layer and the first interconnect;

forming a fifth dielectric layer over the fourth dielectric layer;

forming a second dual-damascene structure comprising:
 a second interconnect extending through the fifth dielectric layer; and
 a second plurality of vias extending through the fourth dielectric layer between the second interconnect and the first interconnect; and forming a through-silicon-via (TSV) structure laterally offset from the first and second interconnects by:
 after forming the first, second, third, fourth, and fifth dielectric layers, forming a recess extending through the first, second, third, fourth, and fifth dielectric layers and into the substrate;
 filling a first portion of the recess with a first conductive material; and
 filling a second portion of the recess with a second conductive material;

wherein the filling of the second portion of the recess with the second conductive material occurs simultaneously with the forming of the second dual-damascene structure, and wherein a depth of the second portion of the recess relative to a top surface of the fifth dielectric layer is equal to a thickness of the fifth dielectric layer.

12. The method of claim 11, wherein the first and second conductive materials have substantially the same composition.

13. The method of claim 11, wherein the forming of the TSV structure further comprises forming a TSV liner along internal surfaces of the recess prior to filling the first portion of the recess with the first conductive material.

14. The method of claim 13, further comprising forming first and second barrier layers substantially simultaneously, including:

forming the first barrier layer along internal surfaces of at least one opening defined in at least one of the first, second, third, fourth, and fifth dielectric layers, the at least one opening being different from the recess; and forming the second barrier layer along a surface of the first conductive material.

15. A method, comprising:

forming a first metallization layer in a first dielectric layer over a substrate;

forming a second dielectric layer over the first dielectric layer;

after forming the second dielectric layer, etching a through substrate via (TSV) opening through the first and second dielectric layers and extending at least partially through the substrate, the etching occurring from a topmost portion of the TSV opening to a bottommost portion of the TSV opening in a single etch process;

lining the TSV opening with a first barrier layer;

partially filling the TSV opening with a first conductive material;

after partially filling the TSV opening with the first conductive material, patterning the second dielectric layer to form a damascene opening therein, the damascene opening being laterally displaced from the TSV opening, wherein a depth of the damascene opening relative to a top surface of the second dielectric layer is substantially the same as a depth of the partially filled TSV opening relative to the top surface of the second dielectric layer;

simultaneously lining the partially filled TSV opening and the damascene opening with a second barrier layer; and simultaneously filling the partially filled TSV opening and the damascene opening with a second conductive material.

16. The method of claim 15, further comprising lining the TSV opening with a TSV liner before lining the TSV opening with the first barrier layer.

17. The method of claim 15, further comprising planarizing the second conductive material to be substantially planar with the top surface of the second dielectric layer.

18. The method of claim 15, further comprising:
forming one or more additional metallization layers in one or more respective additional dielectric layers before forming the second dielectric layer, and etching through the one or more respective additional dielectric layers when etching the TSV opening.

19. The method of claim 18, wherein at least one of the one or more respective additional dielectric layers is a dielectric gas.

20. The method of claim 16, wherein the TSV liner comprises a dielectric material.

* * * * *